United States Patent
Madinger et al.

(10) Patent No.: US 10,427,246 B2
(45) Date of Patent: Oct. 1, 2019

(54) INDIRECT SURFACE FINISHING DURING HYBRID MANUFACTURING

(71) Applicant: Hamilton Sundstrand Corporation, Charlotte, NC (US)

(72) Inventors: Alexander Madinger, Hartford, CT (US); William Louis Wentland, Rockford, IL (US); Diana Giulietti, Weatogue, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 15/901,532

(22) Filed: Feb. 21, 2018

(65) Prior Publication Data

US 2019/0255655 A1    Aug. 22, 2019

(51) Int. Cl.
| | |
|---|---|
| *C23F 1/20* | (2006.01) |
| *B23K 26/342* | (2014.01) |
| *B33Y 40/00* | (2015.01) |
| *B33Y 10/00* | (2015.01) |
| *H01J 37/34* | (2006.01) |

(52) U.S. Cl.
CPC ............ *B23K 26/342* (2015.10); *B33Y 10/00* (2014.12); *B33Y 40/00* (2014.12); *C23F 1/20* (2013.01); *H01J 37/3435* (2013.01)

(58) Field of Classification Search
CPC ...... H01J 37/3435; B33Y 10/00; B33Y 40/00; C23F 1/20; B23K 26/342; C23C 14/3414
USPC .................................. 216/75, 100, 102, 108
See application file for complete search history.

(56) References Cited

U.S. PATENT DOCUMENTS

| | | | |
|---|---|---|---|
| 5,286,573 A | 2/1994 | Prinz | |
| 8,617,661 B2* | 12/2013 | Newkirk | ............ B23K 20/1255 427/367 |
| 2008/0073600 A1* | 3/2008 | Appleby | ............... B29C 33/302 250/505.1 |
| 2016/0028040 A1* | 1/2016 | Lee | ..................... H01L 51/5215 257/40 |
| 2016/0122541 A1 | 5/2016 | Jaker et al. | |

* cited by examiner

*Primary Examiner* — Lan Vinh
(74) *Attorney, Agent, or Firm* — Snell & Wilmer, L.L.P.

(57) ABSTRACT

A hybrid manufacturing method may comprise depositing a secondary material onto a workpiece, finishing the secondary material to form a finished surface on the secondary material, depositing a primary material onto the finished surface, subsequent to depositing the secondary material, wherein a surface of the primary material interfaces the finished surface, and the surface of the primary material is complementary to the finished surface, and removing the secondary material.

19 Claims, 6 Drawing Sheets

INDIRECT SURFACE FINISHING DURING HYBRID MANUFACTURING

FIELD

The present disclosure relates to hybrid manufacturing, and more specifically, to methods for hybrid manufacturing.

BACKGROUND

Hybrid manufacturing combines additive deposition and subtractive milling processes when making a part, allowing the operation to switch between the two at chosen intervals. The deposited material typically has a rough surface finish, but can then be finished by milling. The ability to switch between the two processes allows for the finishing of surfaces that would not be line-of-sight for the finished piece. However, certain geometries may be difficult for the mill to reach and require a high frequency of process switching, adding significant time to the manufacturing process.

SUMMARY

A hybrid manufacturing method is disclosed, comprising depositing a secondary material onto a workpiece, finishing the secondary material to form a finished surface on the secondary material, depositing a primary material onto the finished surface, subsequent to depositing the secondary material, wherein a surface of the primary material interfaces the finished surface, and the surface of the primary material is complementary to the finished surface, and removing the secondary material.

In various embodiments, the secondary material is deposited using directed energy deposition (DED).

In various embodiments, the primary material is deposited using DED.

In various embodiments, the surface of the primary material is smooth in response to interfacing the finished surface.

In various embodiments, the secondary material is removed by chemical milling.

In various embodiments, the primary material comprises a higher corrosion resistance than the secondary material.

In various embodiments, the secondary material is removed by melting the secondary material from the primary material.

In various embodiments, the primary material comprises a higher melting point temperature than the secondary material.

In various embodiments, the primary material is deposited independently from the secondary material.

A hybrid manufacturing method is disclosed, comprising depositing, by a machine, a secondary material onto a workpiece using a first head, finishing, by the machine, the secondary material to form a finished surface on the secondary material using a second head, and depositing, by the machine, a primary material onto the finished surface, subsequent to depositing the secondary material, wherein a surface of the primary material interfaces the finished surface, and the surface of the primary material is complementary to the finished surface, wherein the primary material is deposited using the first head.

In various embodiments, the secondary material is deposited using directed energy deposition (DED).

In various embodiments, the primary material is deposited using DED.

In various embodiments, the surface of the primary material is smooth in response to interfacing the finished surface.

In various embodiments, the hybrid manufacturing method further comprises removing the secondary material from the workpiece.

In various embodiments, the secondary material is removed by chemical milling.

In various embodiments, the primary material comprises a higher corrosion resistance than the secondary material.

In various embodiments, the secondary material is removed by melting the secondary material from the primary material.

In various embodiments, the primary material comprises a higher melting point temperature than the secondary material.

A hybrid manufacturing method is disclosed, comprising depositing, using directed energy deposition (DED), a secondary material onto a workpiece, finishing the secondary material to form a finished surface on the secondary material, wherein a surface roughness of the finished surface is minimized in response to the finishing, depositing, using DED, a primary material onto the finished surface, wherein a surface roughness of a surface of the primary material that is interfacing the finished surface is similar to that of the finished surface in response to the interfacing, and removing the secondary material from the primary material.

In various embodiments, the primary material is a first metal and the secondary material is a second metal.

The foregoing features and elements may be combined in various combinations without exclusivity, unless expressly indicated herein otherwise. These features and elements as well as the operation of the disclosed embodiments will become more apparent in light of the following description and accompanying drawings.

Figure 1B:
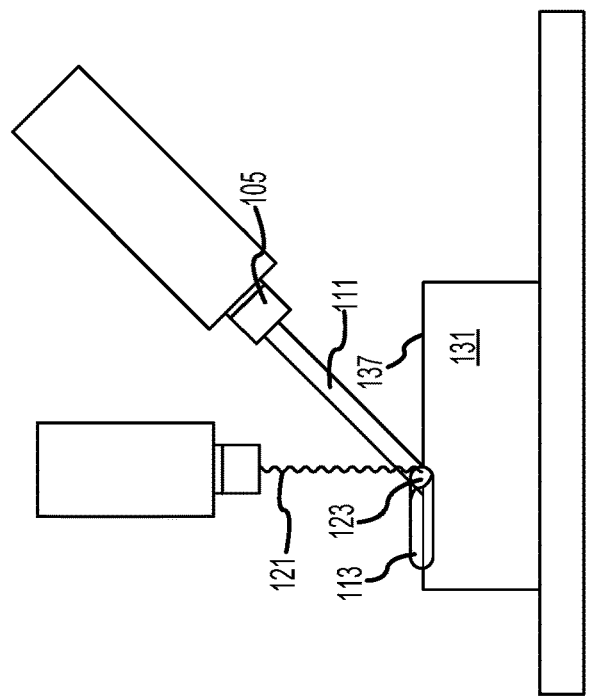
FIG. 1B is a schematic view of a material being deposited onto a workpiece using wire DED, in accordance with various embodiments.

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration. While these exemplary embodiments are described in sufficient detail to enable those skilled in the art to practice the disclosure, it should be understood that other embodiments may be realized and that logical changes and adaptations in design and construction may be made in accordance with this disclosure and the teachings herein without departing from the spirit and scope of the disclosure. Thus, the detailed description herein is presented for purposes of illustration only and not of limitation.

A hybrid manufacturing method, as described herein, may include depositing a secondary material onto a workpiece. A surface of the secondary material may be finished to form a finished surface, wherein the finished surface becomes an interface with a primary material. The primary material may be deposited onto the finished surface. A smooth surface of the primary material may be formed at the interface. The secondary material may be subsequently removed, for example by melting and/or chemical removal, to expose a smooth surface on the primary material. The hybrid manufacturing method may be particularly useful for forming a smooth surface on a part that is in a location that is physically difficult to reach on the finished part. The hybrid manufacturing method may be particularly useful when a difficult to machine material, such as certain nickel alloys for example, is used as the primary material. In this regard, a smooth surface on the primary material may be formed in response to a smooth surface being physically machined onto an easier to machine secondary material. In this regard, the secondary material may be a softer metal than the primary material.

In various embodiments, Directed Energy Deposition (DED) as used herein, may refer to an additive manufacturing technology specifically used to create three-dimensional parts from metals and alloys. In various embodiments, and with reference to FIG. 1A, as used herein, DED may include powder DED, such as Laser Metal Deposition (LMD) and/or Laser Engineered Net Shaping (LENS), which utilizes a powder-fed system 100 to blow powder 110 through a nozzle 106, which is melted by a laser beam 120 on the surface 136 of the workpiece 130. A melt pool 122 may be formed on the surface 136, whereby deposited material 112 may fuse to workpiece 130. Powder DED may incorporate inert gas shielding 140 in either an open environment (gas surrounding the laser), or in a sealed gas enclosure or chamber. This process itself is highly precise and is based on an automated deposition of a layer of material with a thickness varying between 0.1 mm (0.0393 in.) and 5 mm (0.19685 in.). The metallurgical bonding of the cladding material with the base material and the absence of undercutting tend to distinguish this process from others. DED is dissimilar to other welding techniques in that a low heat input penetrates the substrate.

Figure 1A:
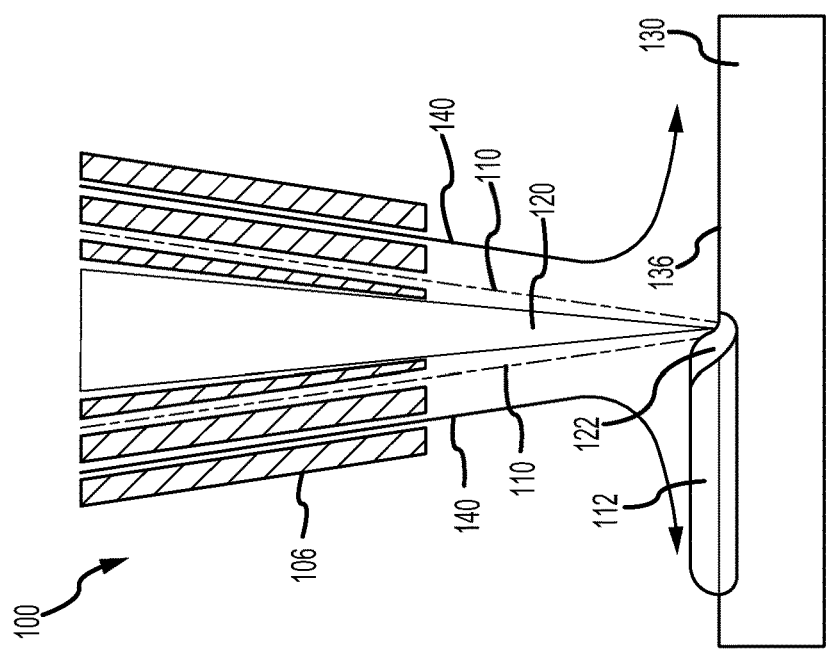
FIG. 1A is a section view of a material being deposited onto a workpiece using powder directed energy deposition (DED), in accordance with various embodiments.

In various embodiments, and with reference to FIG. 1B, as used herein, DED may include wire DED, such as Laser Metal Deposition-wire (LMD-w), where wire 111 is fed through a nozzle 105 that is melted by a laser 121. A melt pool 123 may be formed on the surface 137, whereby deposited material 113 may fuse to workpiece 131. Wire DED may incorporate inert gas shielding in either an open environment (gas surrounding the laser), or in a sealed gas enclosure or chamber.

Figure 2:
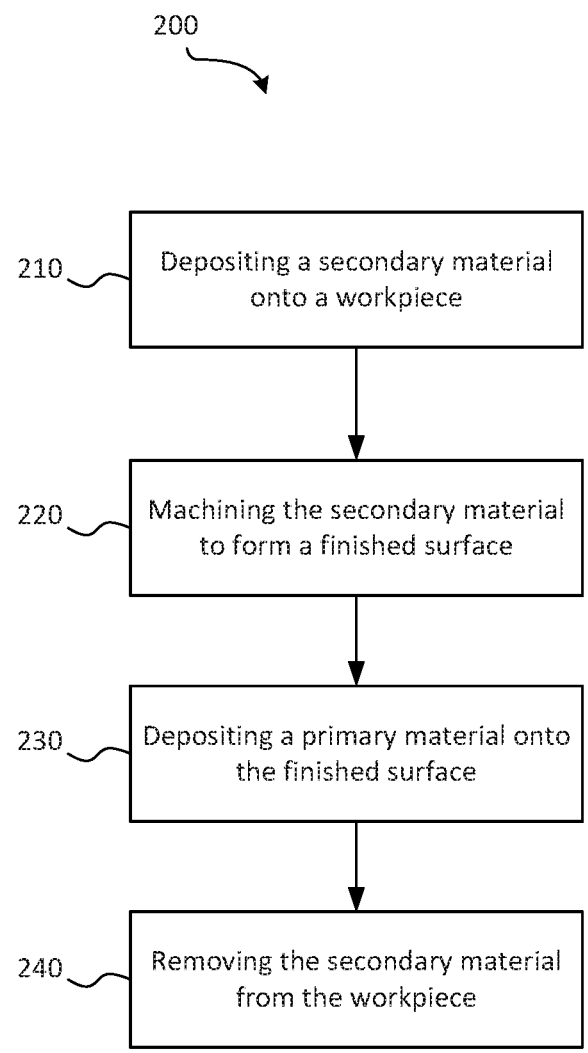
FIG. 2 illustrates a hybrid manufacturing method, in accordance with various embodiments.

With reference to FIG. 2, a hybrid manufacturing method 200 is illustrated, in accordance with various embodiments. Method 200 includes depositing a secondary material onto a workpiece (step 210). Method 200 includes finishing the secondary material to form a finished surface (step 220). Method 200 includes depositing a primary material onto the finished surface (step 230). Method 200 includes removing the secondary material from the workpiece (step 240).

Figure 3A:
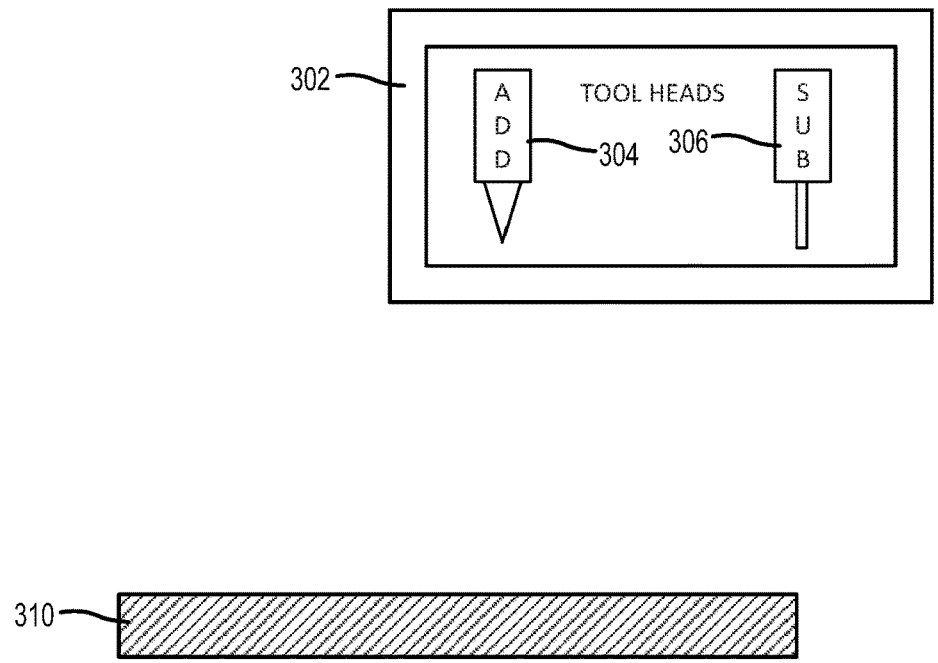
FIG. 3A illustrates a workpiece and a machine for hybrid manufacturing method having an additive manufacturing head and a subtractive manufacturing head, in accordance with various embodiments.

With combined reference to FIG. 2 and FIG. 3A, a machine 302 may be provided for manufacturing a part or a feature on a part. Machine 302 may include an additive manufacturing head (also referred to herein as a first head) 304 and a subtractive manufacturing head (also referred to herein as a second head) 306. Machine 302 may be configured for automated manufacturing. For example, machine 302 may include a multi-axis machine comprising an arm 380 whereby first head 304 and/or second head 306 may be moved. Machine 302 and first head 304 may be an additive machine. Thus, first head 304 may be configured for DED as described in FIG. 1A and/or FIG. 1B. Second head 306 may comprise a tool that rotates with interchangeable cutting heads. Second head 306 may be any suitable tool for subtractive manufacturing, including, but not limited to, a cutting tool such as a drill, a mill, a reamer, etc. In this regard, machine 302 may be a hybrid manufacturing machine configured for both additive manufacturing and subtractive manufacturing. It is also contemplated that first head 304 and second head 306 may be coupled to separate machines. A workpiece 310 may be provided, upon which a part or feature may be manufactured with machine 302. Workpiece 310 may comprise an existing part upon which a feature may be manufactured or may comprise a work surface upon which a separate part may be manufactured.

Figure 3B:
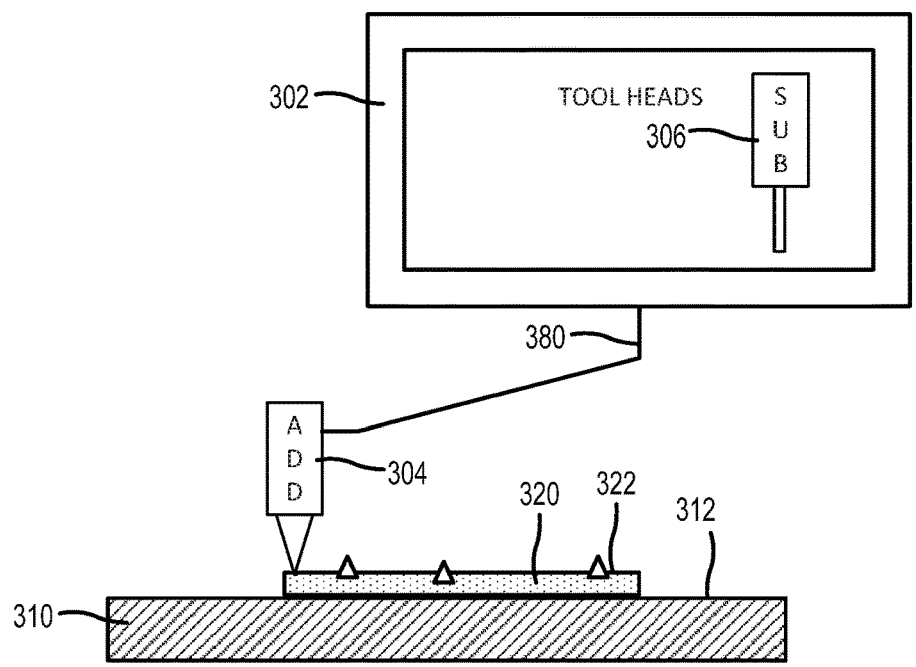
FIG. 3B and FIG. 3C illustrates a secondary material being deposited onto the workpiece, in accordance with various embodiments.

With combined reference to FIG. 2 and FIG. 3B, step 210 may include depositing secondary material 320 onto surface 312 of workpiece 310. Secondary material 320 may be deposited using DED. Secondary material 320 may be deposited using first head 304. In various embodiments, secondary material 320 may be a metal or metal alloy. Although illustrated as a linear surface, it is contemplated that surface 312 may comprise a complex, three-dimensional geometry, such as a frustoconical surface for example. A surface 322 of secondary material 320 may be uneven, or rough.

Figure 3C:
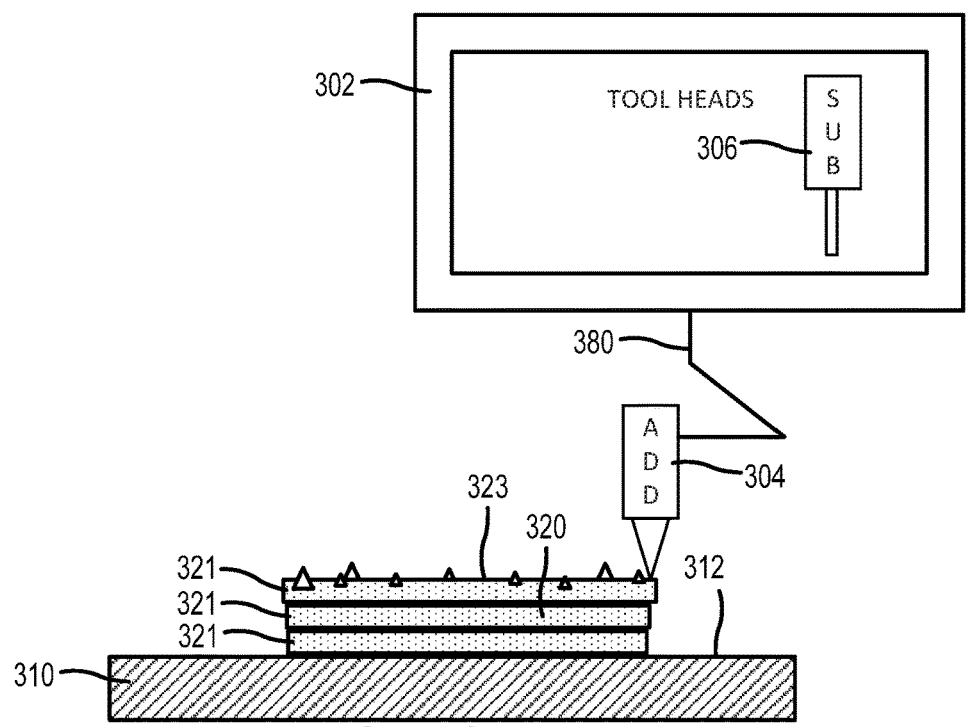

With combined reference to FIG. 2 and FIG. 3C, step 210 may include depositing a plurality of layers 321 of secondary material 320 onto surface 312. Each layer 321 may be subsequently deposited to form multiple layers stacked onto each other depending on the desired thickness of secondary material 320. The outer surface 323 of secondary material 320 may be a rough surface.

Figure 3D:
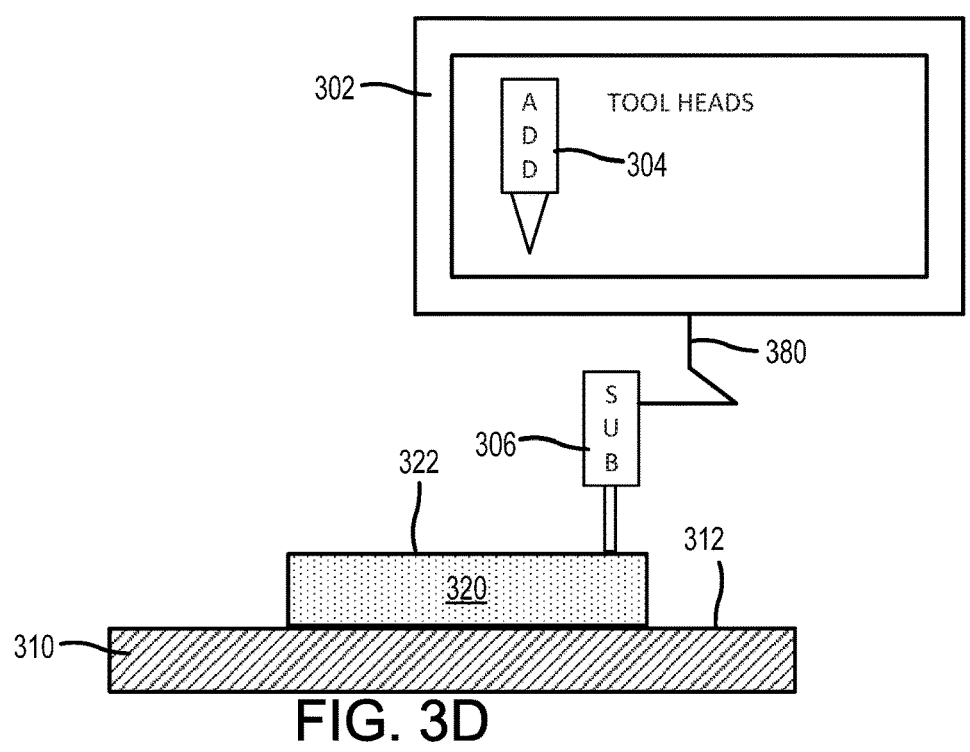
FIG. 3D illustrates the secondary material being prepared for a primary material by finishing a finished surface on the secondary material, in accordance with various embodiments.

With combined reference to FIG. 2 and FIG. 3D, step 220 may include finishing secondary material 320 to form a finished surface 322. As used herein, the term "finishing" may refer to a mechanical process, a laser process, and/or a chemical process for reducing the roughness of a surface, including milling, grinding, sanding, mechanical polishing, electro polishing, among others. Finished surface 322 may be a smooth surface. For example, machine 302 may switch from first head 304 to second head 306. Second head 306 may be used to finish outer surface 323 of FIG. 3C, thereby forming finished surface 322. Finished surface 322 may define the interface of a negative space of a desired part or feature, as described herein with greater detail. As used herein, the term "finished surface" may refer to a surface having an average roughness (Ra) of less than 500 micro inches (12.5 micro meters), and in various embodiments, may refer to a surface having a surface roughness of less than 100 Ra micro inches (2.5 Ra micro meters), and in various embodiments, may refer to a surface having a surface roughness of less than 10 Ra micro inches (0.25 Ra micro meters). In this regard, the term "smooth," as used herein, may refer to an average roughness (Ra) of less than 500 micro inches (12.5 micro meters), and in various embodiments, may refer to a surface roughness of less than 100 Ra micro inches (2.5 Ra micro meters), and in various embodiments, may refer to a surface roughness of less than 10 Ra micro inches (0.25 Ra micro meters).

Figure 3E:
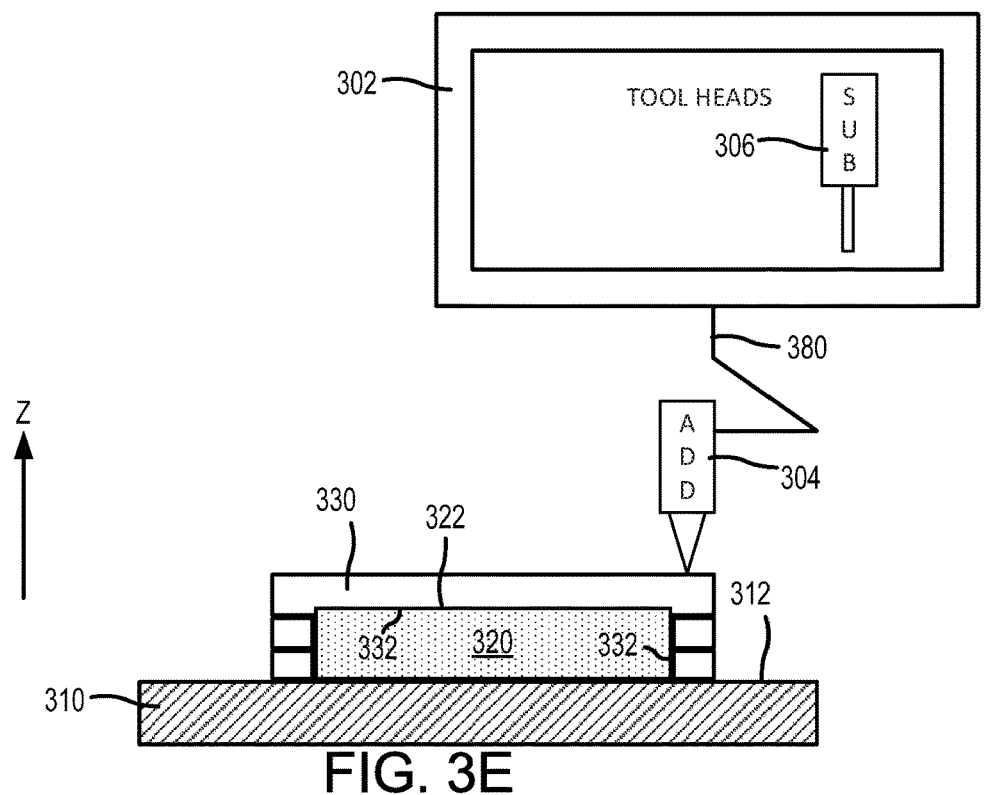
FIG. 3E illustrates the primary material being deposited onto the secondary material, in accordance with various embodiments.

With combined reference to FIG. 2 and FIG. 3E, step 230 may include depositing a primary material 330 onto secondary material 320. Primary material 330 may be deposited using DED. For example, machine 302 may switch from second head 306 to first head 304 to deposit secondary material 320. In various embodiments, primary material 330 may be a metal or metal alloy. In various embodiments, primary material 330 may be harder than secondary material 320. Primary material 330 may be deposited over finished surface 322. Inner surface 332 of primary material 330 may interface with finished surface 322. Inner surface 332 of primary material 330 may comprise a smooth surface in response to being deposited against finished surface 322. In various embodiments, primary material 330 and workpiece 310 may be made from the same material. Each layer of primary material 330, along the Z-direction, may be deposited separately from secondary material 320. In this regard, primary material 330 may be deposited, independent from the deposition of secondary material 320.

Figure 3F:
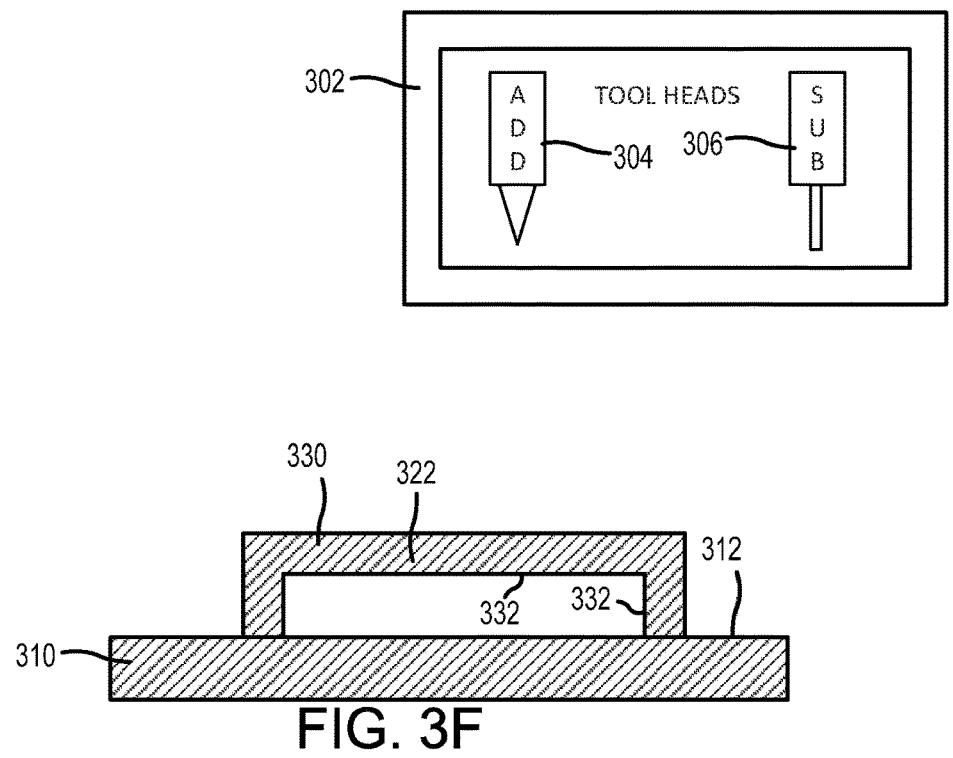
FIG. 3F illustrates the primary material after the secondary material has been removed, wherein a smooth surface is left over at the interface of the primary material and the finished surface of the secondary material, in accordance with various embodiments.

With combined reference to FIG. 2 and FIG. 3F, step 240 may include removing secondary material 320, with momentary reference to FIG. 3E, from workpiece 310. Secondary material 320 may be removed in a manner so as to not destroy primary material 330. For example, secondary material 320 may be melted from workpiece 310. In this regard, heat may be applied to secondary material 320 to melt secondary material 320 from workpiece 310. Secondary material 320 may be heated above a melting point of secondary material 320, but below a melting point of primary material 330. In this regard, primary material 330 may comprise a higher melting point temperature than that of secondary material 320. For example, primary material 330 may be a steel alloy and secondary material 320 may be aluminum. However, primary material 330 may be any suitable metal having a higher melting point temperature than that of secondary material 320. In this regard primary material 330 may be referred to herein as being a first metal and secondary material 320 may be referred herein to as being a second metal. In various embodiments, secondary material 320 may be removed using centrifugal force. In various embodiments, secondary material 320 may be removed by placing the workpiece 310 in an oven.

In various embodiments, secondary material 320 may be removed by chemical milling. For example, a chemical, such as an acid for example, may be applied to secondary material 320 to corrode or dissolve secondary material from workpiece 310. In this regard, primary material 330 may comprise a higher corrosion resistance than secondary material 320. For example, primary material 330 may be titanium and secondary material 320 may be a low carbon steel. However, primary material 330 may be any suitable metal having a higher corrosion resistance than that of secondary material 320. The material for primary material 330 and secondary material 320 may be chosen depending on the chemicals available for removing secondary material 320. The chemical used for removing secondary material 320 may be chosen to remove secondary material 320, without structurally damaging primary material 330.

In various embodiments, inner surface 332 may be formed in primary material 330 without having to physically finish inner surface 332, which may be in a location that is difficult to reach. In this regard, inner surface 332 may be referred to herein as a finished surface or a smooth surface, even though inner surface 332 may not be physically finished using a surface finishing method, such as sanding, milling, grinding, chemical finishing, etc. Stated differently, surface 332 may be indirectly finished in response to being deposited over finished surface 322. In this regard, surface 332 may comprise a smoothness similar to that of finished surface 322. Stated differently, a surface roughness of finished surface 322 may tend to be minimized in response to the finishing, and a surface roughness of surface 332 may be similar to that of finished surface 322. For example, inner surface 332 may comprise a surface roughness of less than 100 Ra micro inches (2.5 Ra micro meters).

Figure 3G:
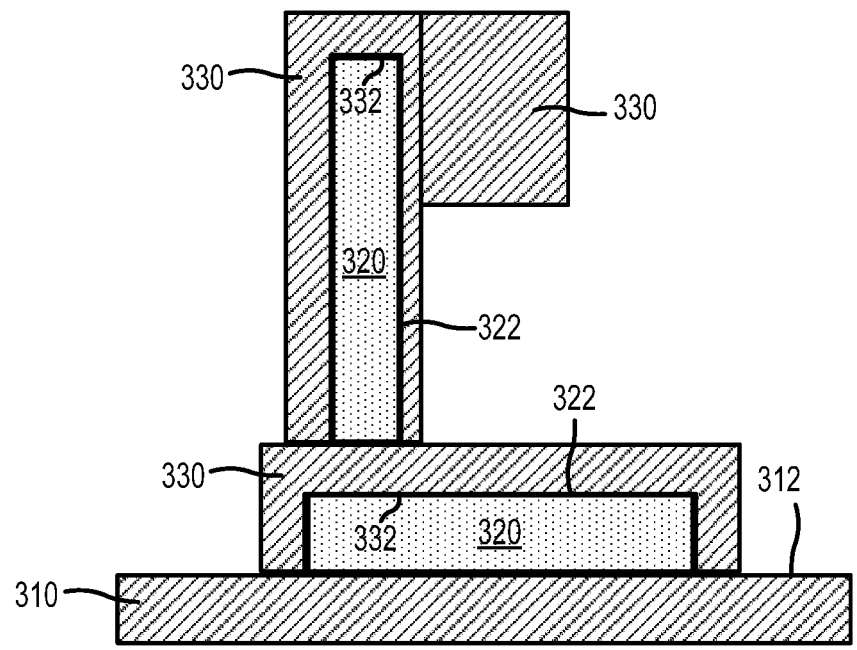
FIG. 3G illustrates various features formed onto the workpiece by repeating the steps described in FIG. 3B through FIG. 3E, in accordance with various embodiments.
Figure 3H:
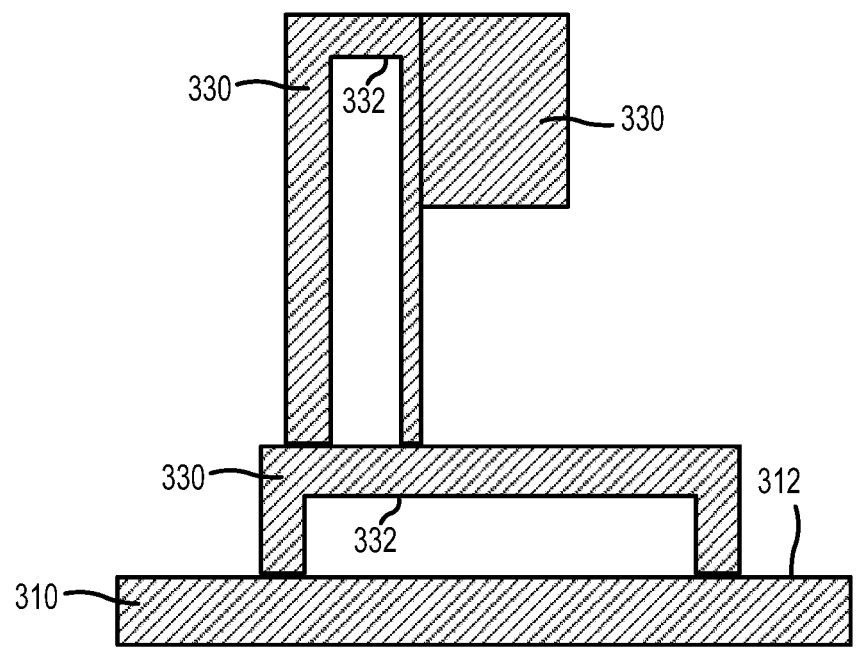
FIG. 3H illustrates the various features of FIG. 3G after the secondary material has been removed, in accordance with various embodiments.

With combined reference to FIG. 2, FIG. 3G, and FIG. 3H, steps 210 through step 240 may be repeated for forming a plurality of features having smooth surfaces 332 in difficult to reach locations. With respect to FIG. 3G and FIG. 3H, elements with like element numbering, as depicted in FIG. 3E and FIG. 3F, are intended to be the same and will not necessarily be repeated for the sake of clarity.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure.

The scope of the disclosure is accordingly to be limited by nothing other than the appended claims, in which reference to an element in the singular is not intended to mean "one and only one" unless explicitly so stated, but rather "one or more." It is to be understood that unless specifically stated otherwise, references to "a," "an," and/or "the" may include one or more than one and that reference to an item in the singular may also include the item in the plural. All ranges and ratio limits disclosed herein may be combined.

Moreover, where a phrase similar to "at least one of A, B, and C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

The steps recited in any of the method or process descriptions may be executed in any order and are not necessarily limited to the order presented. Furthermore, any reference to singular includes plural embodiments, and any reference to more than one component or step may include a singular embodiment or step. Elements and steps in the figures are illustrated for simplicity and clarity and have not necessarily been rendered according to any particular sequence. For example, steps that may be performed concurrently or in different order are illustrated in the figures to help to improve understanding of embodiments of the present disclosure.

Any reference to attached, fixed, connected or the like may include permanent, removable, temporary, partial, full and/or any other possible attachment option. Additionally, any reference to without contact (or similar phrases) may also include reduced contact or minimal contact. Surface shading lines may be used throughout the figures to denote different parts or areas but not necessarily to denote the same or different materials. In some cases, reference coordinates may be specific to each figure.

Systems, methods and apparatus are provided herein. In the detailed description herein, references to "one embodiment," "an embodiment," "various embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it may be within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element is intended to invoke 35 U.S.C. 112(f) unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A hybrid manufacturing method, comprising:
   depositing a secondary material onto a workpiece;
   finishing the secondary material to form a finished surface on the secondary material;
   depositing a primary material onto the finished surface, subsequent to depositing the secondary material, wherein a surface of the primary material interfaces the finished surface, and the surface of the primary material is complementary to the finished surface; and
   removing the secondary material from the workpiece.

2. The hybrid manufacturing method of claim 1, wherein the secondary material is deposited using directed energy deposition (DED).

3. The hybrid manufacturing method of claim 2, wherein the primary material is deposited using DED.

4. The hybrid manufacturing method of claim 3, wherein the surface of the primary material is smooth in response to interfacing the finished surface.

5. The hybrid manufacturing method of claim 3, wherein the primary material is deposited independently from the secondary material.

6. The hybrid manufacturing method of claim 3, wherein the secondary material is removed by chemical milling.

7. The hybrid manufacturing method of claim 6, wherein the primary material comprises a higher corrosion resistance than the secondary material.

8. The hybrid manufacturing method of claim 3, wherein the secondary material is removed by melting the secondary material from the primary material.

9. The hybrid manufacturing method of claim 8, wherein the primary material comprises a higher melting point temperature than the secondary material.

10. A hybrid manufacturing method, comprising:
    depositing, by a machine, a secondary material onto a workpiece using a first head;
    finishing, by the machine, the secondary material to form a finished surface on the secondary material using a second head; and
    depositing, by the machine, a primary material onto the finished surface, subsequent to depositing the secondary material, wherein a surface of the primary material interfaces the finished surface, and the surface of the primary material is complementary to the finished surface,
    wherein the primary material is deposited using the first head; and
    removing the secondary material from the workpiece.

11. The hybrid manufacturing method of claim 10, wherein the secondary material is removed by chemical milling.

12. The hybrid manufacturing method of claim 11, wherein the primary material comprises a higher corrosion resistance than the secondary material.

13. The hybrid manufacturing method of claim 10, wherein the secondary material is deposited using directed energy deposition (DED).

14. The hybrid manufacturing method of claim 13, wherein the primary material is deposited using DED.

15. The hybrid manufacturing method of claim 14, wherein the surface of the primary material is smooth in response to interfacing the finished surface.

16. The hybrid manufacturing method of claim 14, wherein the secondary material is removed by melting the secondary material from the primary material.

17. The hybrid manufacturing method of claim 16, wherein the primary material comprises a higher melting point temperature than the secondary material.

18. A hybrid manufacturing method, comprising:
    depositing, using directed energy deposition (DED), a secondary material onto a workpiece;
    finishing the secondary material to form a finished surface on the secondary material, wherein a surface roughness of the finished surface is minimized in response to the finishing;
    depositing, using DED, a primary material onto the finished surface, wherein a surface roughness of a surface of the primary material that is interfacing the finished surface is similar to that of the finished surface in response to the interfacing; and removing the secondary material from the primary material.

19. The hybrid manufacturing method of claim 18, wherein the primary material is a first metal and the secondary material is a second metal.

* * * * *